(12) United States Patent
Kim et al.

(10) Patent No.: US 12,437,719 B2
(45) Date of Patent: *Oct. 7, 2025

(54) DISPLAY DEVICE

(71) Applicant: SAMSUNG DISPLAY CO., LTD., Yongin-si (KR)

(72) Inventors: Yanghee Kim, Yongin-si (KR); Wonkyu Kwak, Yongin-si (KR); Byungsun Kim, Yongin-si (KR); Bongwon Lee, Yongin-si (KR); Sujin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/102,992

(22) Filed: Jan. 30, 2023

(65) Prior Publication Data
US 2023/0178026 A1    Jun. 8, 2023

Related U.S. Application Data

(63) Continuation of application No. 17/239,969, filed on Apr. 26, 2021, now Pat. No. 11,568,814, which is a continuation of application No. 16/573,240, filed on Sep. 17, 2019, now Pat. No. 10,997,919.

(30) Foreign Application Priority Data

Dec. 21, 2018  (KR) .......................... 10-2018-0167899

(51) Int. Cl.
*G09G 3/3258*    (2016.01)
*G09G 3/3291*    (2016.01)

(52) U.S. Cl.
CPC ......... *G09G 3/3258* (2013.01); *G09G 3/3291* (2013.01); *G09G 2310/0297* (2013.01)

(58) Field of Classification Search
CPC ............... G09G 3/3258; G09G 3/3291; G09G 2310/0297; G09G 2300/0426
See application file for complete search history.

(56) References Cited

U.S. PATENT DOCUMENTS

| | | | |
|---|---|---|---|
| 7,738,512 | B2 | 6/2010 | Shin |
| 8,575,628 | B2 | 11/2013 | Kim et al. |
| 9,349,322 | B2 | 5/2016 | Kim et al. |
| 9,887,256 | B2 | 2/2018 | Kim et al. |

(Continued)

FOREIGN PATENT DOCUMENTS

| | | |
|---|---|---|
| CN | 105470263 A | 4/2016 |
| CN | 107274837 A | 10/2017 |

(Continued)

*Primary Examiner* — Priyank J Shah
(74) *Attorney, Agent, or Firm* — CANTOR COLBURN LLP

(57) ABSTRACT

A display device includes a display area of various shapes, has a reduced dead space, and displays an image. Further, the display device includes a display unit including a rounded corner portion, a first driving voltage supply line arranged in a first direction in a non-display area on one side of the display unit, a plurality of first driving voltage lines which supplies a driving voltage to a plurality of pixels and is arranged in a second direction that intersects with the first direction and being connected to the first driving voltage supply line, and a plurality of second driving voltage lines disconnected from the first driving voltage supply line.

19 Claims, 12 Drawing Sheets

(56) References Cited

U.S. PATENT DOCUMENTS

| | | |
|---|---|---|
| 10,062,316 B2 | 8/2018 | Kim et al. |
| 10,312,309 B2 | 6/2019 | Lin et al. |
| 2005/0117611 A1 | 6/2005 | Shin |
| 2005/0258771 A1 | 11/2005 | Kang et al. |
| 2015/0199936 A1 | 7/2015 | Watanabe et al. |
| 2016/0217740 A1 | 7/2016 | Lee et al. |
| 2016/0260367 A1 | 9/2016 | Kwak et al. |
| 2017/0288002 A1 | 10/2017 | Kim et al. |
| 2018/0204895 A1 | 7/2018 | Lin et al. |
| 2019/0067407 A1 | 2/2019 | Yu et al. |
| 2019/0140036 A1 | 5/2019 | Hyeon et al. |

FOREIGN PATENT DOCUMENTS

| | | |
|---|---|---|
| KR | 20050051312 A | 6/2005 |
| KR | 101178912 B1 | 8/2012 |
| KR | 1020160013359 A | 2/2016 |
| KR | 1020160092595 A | 8/2016 |
| KR | 1020160108639 A | 9/2016 |
| KR | 1020170114028 A | 10/2017 |
| KR | 1020170132399 A | 12/2017 |
| KR | 20180049005 A | 5/2018 |
| KR | 1020180049005 A | 5/2018 |
| KR | 1020190053314 A | 5/2019 |

DISPLAY DEVICE

This application is a continuation of U.S. patent application Ser. No. 17/239,969, filed on Apr. 26, 2021, which is a continuation of U.S. patent application Ser. No. 16/573,240, filed on Sep. 17, 2019, which claims priority to Korean Patent Application No. 10-2018-0167899, filed on Dec. 21, 2018, and all the benefits accruing therefrom under 35 U.S.C. § 119, the content of which in its entirety is herein incorporated by reference.

BACKGROUND

1. Field

One or more embodiments relate to a display device, and more particularly, to a display device which implements various shapes of a display area that displays an image, and simultaneously, includes a reduced dead space.

2. Description of the Related Art

Recently, purposes of a display device are becoming more diversified. Also, as a display device is substantially thin and lightweight, a range of uses thereof is being extended.

As a display device is variously utilized, in designing a shape of the display device, a demand for a technology for increasing a ratio of a display area that provides an image and reducing a non-display area that does not provide an image is increasing.

SUMMARY

One or more embodiments include a display device which implements various shapes of a display area that displays an image, and simultaneously, includes a reduced dead space.

However, it should be understood that embodiments described herein should be considered in a descriptive sense only and not for limitation of the invention.

Additional embodiments will be set forth in part in the description which follows and, in part, will be apparent from the description, or may be learned by practice of the presented embodiments.

In one or more embodiments, a display device includes a display unit disposed over a substrate and including a first display area and a second display area, each of the first display area and the second display area including a plurality of pixel arrays and the second display area further including a rounded corner portion, a first driving voltage supply line extending in a first direction in a non-display area on one side of the display unit, a plurality of first driving voltage lines which supplies a driving voltage to a plurality of pixels, the plurality of first driving voltage lines being arranged in the first display area in the first direction and extending in a second direction that intersects with the first direction, extending to an area between the first display area and the first driving voltage supply line, and being connected to the first driving voltage supply line, and a plurality of second driving voltage lines which supplies the driving voltage to the plurality of pixels, the plurality of second driving voltage lines being arranged in the second display area in the first direction, and being disconnected from the first driving voltage supply line in an area between the second display area and the first driving voltage supply line.

In an embodiment, the plurality of first driving voltage lines and the plurality of second driving voltage lines may be electrically connected to a plurality of connection lines arranged in the second direction.

In an embodiment, the plurality of connection lines may intersect with the plurality of first driving voltage lines and the plurality of second driving voltage lines to constitute a mesh shape.

In an embodiment, the plurality of second driving voltage lines may supply the driving voltage to the plurality of pixels disposed in the second display area through the plurality of connection lines.

In an embodiment, the display device may further include a switching unit including a plurality of demultiplexers which is arranged in the non-display area, demuxes a data signal and supplies the demuxed data signal to a plurality of data lines, and a second driving voltage supply line arranged in parallel to the first driving voltage supply line with the switching unit therebetween, and connected to a terminal unit at an edge of the substrate, where the display unit may include a plurality of scan lines and a plurality of data lines respectively connected to the plurality of pixels.

In an embodiment, the switching unit may include a first switching unit which demuxes a data signal supplied to the first display area, and a second switching unit which demuxes a data signal supplied to the second display area, where a plurality of first demultiplexers included in the first switching unit may be arranged at a first pitch, and a plurality of second demultiplexers included in the second switching unit may be arranged at a second pitch less than the first pitch.

In an embodiment, the first driving voltage supply line and the second driving voltage supply line may be electrically connected to each other through a plurality of connection lines arranged between the plurality of first demultiplexers.

In an embodiment, pixels of the plurality of pixels that are adjacent to an outer edge of the display unit may be arranged stepwise.

In an embodiment, the display unit may have one of a polygonal shape, a circular shape, and an elliptical shape.

In an embodiment, the display device may further include a substrate over which the display unit is disposed, the substrate including curved edges.

In an embodiment, a length of the plurality of second driving voltage lines extending in the second direction may be less than a length of the plurality of first driving voltage lines.

In one or more embodiments, a display device includes a display unit in which a first display area and a second display area including a corner portion at an edge of the first display area are defined, the display unit including a plurality of first pixels and a plurality of second pixels, the plurality of first pixels and the plurality of second pixels being respectively disposed in the first display area and the second display area, and being connected to a plurality of data lines and a plurality of driving voltage lines arranged in a first direction and a plurality of scan lines arranged in a second direction, a scan driver and a data driver arranged in a non-display area, the non-display area being outside of the display unit, a switching unit including a plurality of demultiplexers which is arranged in the non-display area, demuxes a data signal output from the data driver and supplies the demuxed data signal to the plurality of data lines, and a driving voltage supply line arranged in the non-display area and connected to the plurality of driving voltage lines extending from the display unit, where the plurality of driving voltage lines include a first driving voltage line connected to the plurality of first pixels and a second driving voltage line connected to the plurality of second pixels, the first driving voltage line extends to the non-display area and is connected to the driving voltage supply line, and the second driving voltage line is disconnected from the driving voltage supply line in the non-display area.

In an embodiment, the corner portion may have a rounded shape.

In an embodiment, pixels of the plurality of pixels that are adjacent to an outer edge of the display unit may be arranged stepwise.

In an embodiment, the switching unit may further include a first switching unit which demuxes a data signal supplied to the plurality of first pixels, and a second switching unit which demuxes a data signal supplied to the plurality of second pixels, and a plurality of demultiplexers included in the first switching unit may be arranged at a first pitch, and a plurality of demultiplexers included in the second switching unit may be arranged at a second pitch less than the first pitch.

In an embodiment, a driving voltage supplied to the plurality of driving voltage lines may be supplied along a mesh path.

In an embodiment, the display unit may further include a plurality of connection lines arranged in the second direction, the plurality of connection lines being connected to the first driving voltage line and the second driving voltage line by contacting the first driving voltage line and the second driving voltage line.

In an embodiment, an insulating layer may be arranged between the plurality of connection lines, and the first driving voltage line and the second driving voltage line, and the plurality of connection lines may be electrically connected to the first driving voltage line and the second driving voltage line through a contact hole in the insulating layer.

In an embodiment, the driving voltage supply line may include a first driving voltage supply line and a second driving voltage supply line arranged in the second direction with the switching unit therebetween, the plurality of driving voltage lines may be connected to the first driving voltage supply line, and the second driving voltage supply line may be connected to a terminal unit.

In an embodiment, the driving voltage supply line may further include a plurality of connection lines connecting the first driving voltage supply line and the second driving voltage supply line, the plurality of connection lines being disposed between the plurality of demultiplexers.

BRIEF DESCRIPTION OF THE DRAWINGS

These and/or other embodiments will become apparent and more readily appreciated from the following description of the embodiments, taken in conjunction with the accompanying drawings in which.

DETAILED DESCRIPTION

Figure 1:
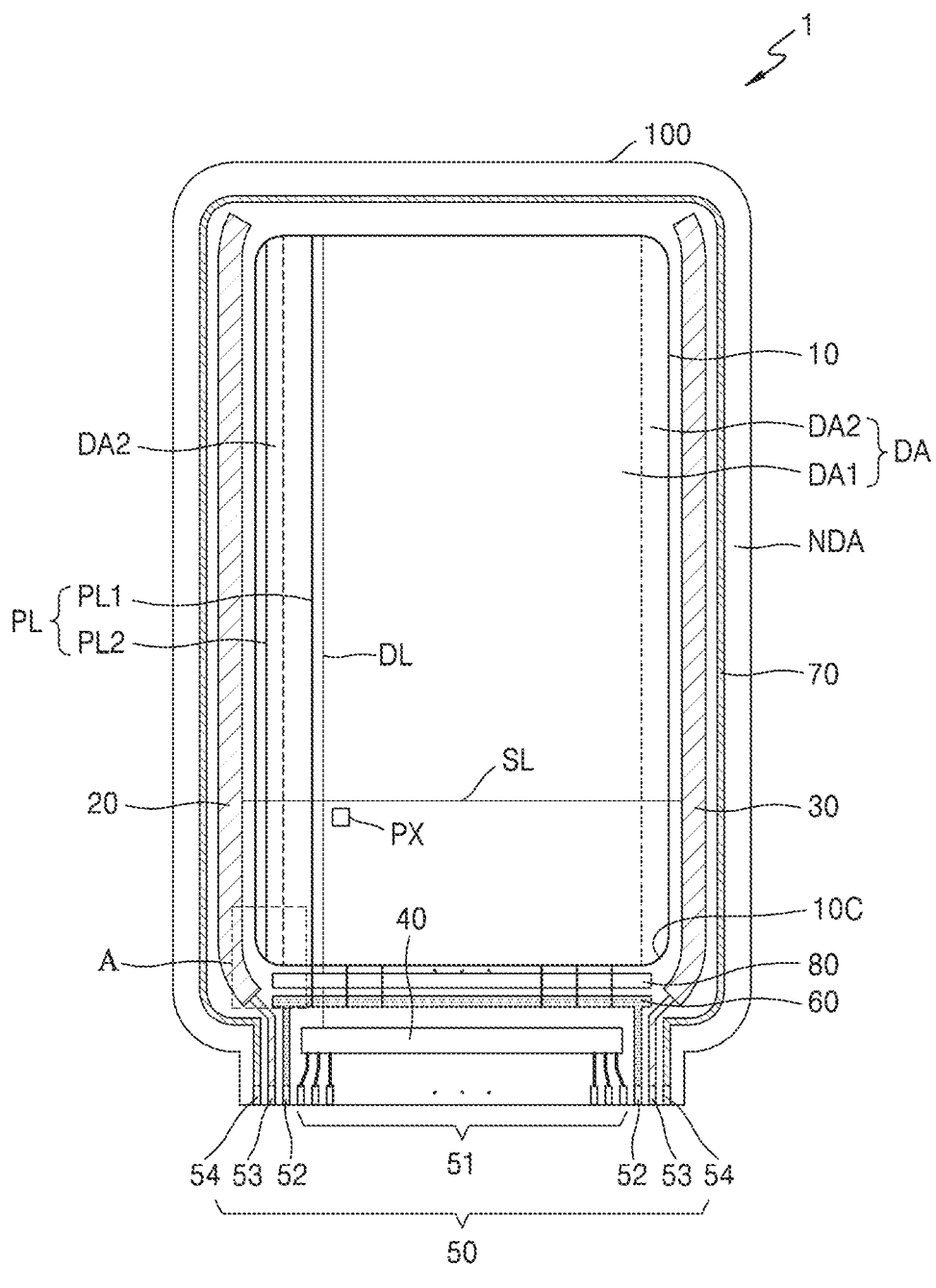
FIG. 1 is a plan view of an embodiment of a display device.
Figure 1:

As the invention allows for various changes and numerous embodiments, embodiments will be illustrated in the drawings and described in detail in the written description. An effect and a characteristic of the invention, and a method of accomplishing these will be apparent when referring to embodiments described with reference to the drawings. This invention may, however, be embodied in many different forms and should not be construed as limited to the embodiments set forth herein.

Hereinafter, the invention will be described more fully with reference to the accompanying drawings, in which embodiments of the invention are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a plan view of an embodiment of a display device 1.

Referring to FIG. 1, the display device 1 includes a display unit 10, first and second scan drivers 20 and 30, a data driver 40, a terminal unit 50, a driving voltage supply line 60, a common voltage supply line 70, and a switching unit 80 arranged over a substrate 100.

The substrate 100 may include a material such as glass including $SiO_2$ as a main component, metal, or an organic material. In an embodiment, the substrate 100 may include a flexible material. In an embodiment, though the substrate 100 may include a flexible plastic material such as polyimide, the invention is not limited thereto. In another embodiment, the plastic material may include at least one of polyethersulfone ("PES"), polyarylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), cellulose triacetate ("TAC"), cellulose acetate propionate ("CAP"), cyclic olefin polymer, and cyclic olefin copolymer, for example.

The display unit 10 includes pixels PX connected to a scan line SL extending in a first direction, a data line DL extending in a second direction that intersects with the first direction, and a driving voltage line PL. Each of the pixels PX may emit, for example, red, green, blue, or white light and include, for example, an organic light-emitting diode. The display unit 10 provides a predetermined image through light emitted from the pixels PX. A display area DA is defined by the pixels PX. In the specification, a non-display area NDA is an area in which the pixels PX are not arranged and represents an area that does not provide an image.

Though the display unit 10 has an approximately quadrangular shape, the display unit 10 may be provided in various shapes such as a polygonal shape, a circular shape, an elliptical shape, or a shape corresponding to a portion of these in various embodiments. In the illustrated embodiment, the display unit 10 has a quadrangular shape entirely and may include a rounded corner portion 10C in which each edge is curved. The substrate 100 over which the display unit 10 is disposed may have curved edges in at least a partial area of an outer edge.

The first and second scan drivers 20 and 30 are arranged in the non-display area NDA of the substrate 100 and generate and transfer a scan signal to each pixel PX through the scan line SL. In an embodiment, the first scan driver 20 may be arranged on the left of the display unit 10 and the second scan driver 30 may be arranged on the right of the display unit 10.

The data driver 40 is arranged in the non-display area NDA of the substrate 100 and generates and transfers a data signal to each pixel PX through the data line DL. The data driver 40 may be arranged on one side of the display unit 10, for example, a lower side in which the terminal unit 50 is arranged below the display unit 10.

The terminal unit 50 is arranged on one end of the substrate 100 and includes a plurality of terminals 51, 52, 53, and 54. The terminal unit 50 is not covered by an insulating layer and is exposed and may be electrically connected to a controller (not shown) such as a flexible printed circuit board or an integrated circuit ("IC") chip, etc. The controller changes a plurality of video signals transferred from the outside to a plurality of video data signals and transfers the changed video signals to the data driver 40 through the terminal 51. Also, the controller may receive a vertical synchronization signal, a horizontal synchronization signal, and a clock signal, generate control signals for controlling driving of the first and second scan drivers 20 and 30, and the data driver 40, and transfer the relevant control signals to the relevant elements. The controller respectively transfers a driving voltage ELVDD and a common voltage ELVSS to the driving voltage supply line 60 and the common voltage supply line 70 through the terminals 52 and 54.

The driving voltage supply line 60 is arranged in the non-display area NDA. In an embodiment, the driving voltage supply line 60 may be arranged between the data driver 40 and the display unit 10, for example. The driving voltage supply line 60 provides the driving voltage ELVDD to the pixels PX. The driving voltage supply line 60 may extend in the first direction and may be connected to a plurality of driving voltage lines PL1 arranged in the first direction.

The common voltage supply line 70 is arranged in the non-display area NDA and provides the common voltage ELVSS to an opposite electrode 223 (refer to FIG. 3) of an organic light-emitting diode of a pixel PX. In an embodiment, the common voltage supply line 70 is provided in a loop in which an opening is defined at one side and may extend along edges of the substrate 100 except the terminal unit 50, for example.

The display unit 10 has an approximately quadrangular shape and includes the rounded corner portion 10C. The rounded corner portion 10C may be defined at each of four edges of the display unit 10 and may be a portion of a circle that is formed at a constant curvature.

The display unit 10 may be defined as a first display area DA1 and a second display area DA2 including the rounded corner portion 10C. The second display areas DA2 may be arranged in the first direction with the first display area DA1 centered therebetween. The plurality of first driving voltage lines PL1 is arranged so as to supply the driving voltage ELVDD to the pixels PX of the first display area DA1, and a plurality of second driving voltage lines PL2 is arranged so as to supply the driving voltage ELVDD to the pixels PX of the second display area DA2.

The lengths, taken along the second direction, of the plurality of first driving voltage lines PL1 and the plurality of second driving voltage lines PL2 extended in the second direction may be different from each other. That is, the length of the plurality of first driving voltage lines PL1 in the second direction may be greater than the length of the plurality of second driving voltage lines PL2 in the second direction. This is because the plurality of first driving voltage lines PL1 extend to the non-display area NDA but the plurality of second driving voltage lines PL2 does not extend to the non-display area NDA and are arranged only inside the second display area DA2.

The switching unit 80 is arranged in the non-display area NDA between the data driver 40 and the display unit 10 and demuxes a data signal and supplies the demuxed data signal to the plurality of data lines DL. The driving voltage supply line 60 may be arranged between the switching unit 80 and the data driver 40.

Figure 2:
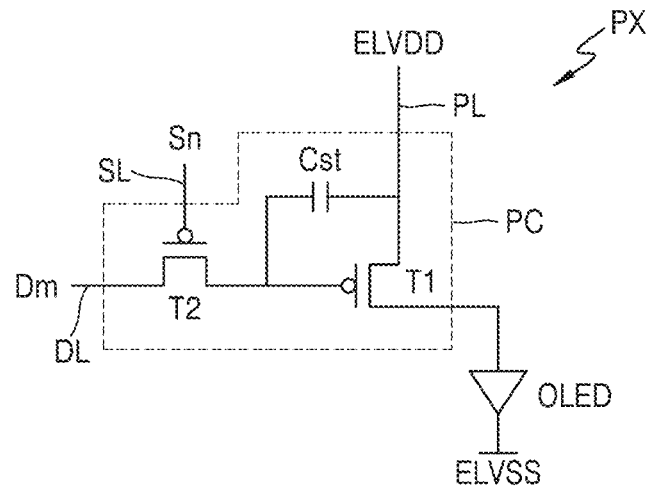
FIG. 2 is an equivalent circuit diagram of an embodiment of a pixel.
Figure 3:
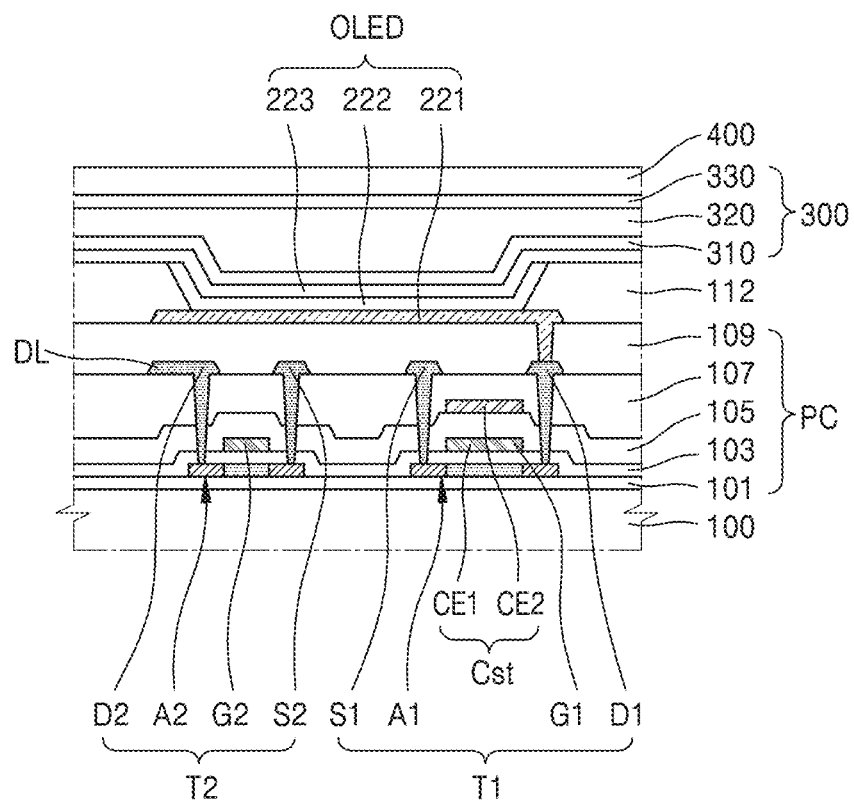
FIGS. 3 and 4 are cross-sectional views of an embodiment of a pixel.
Figure 4:
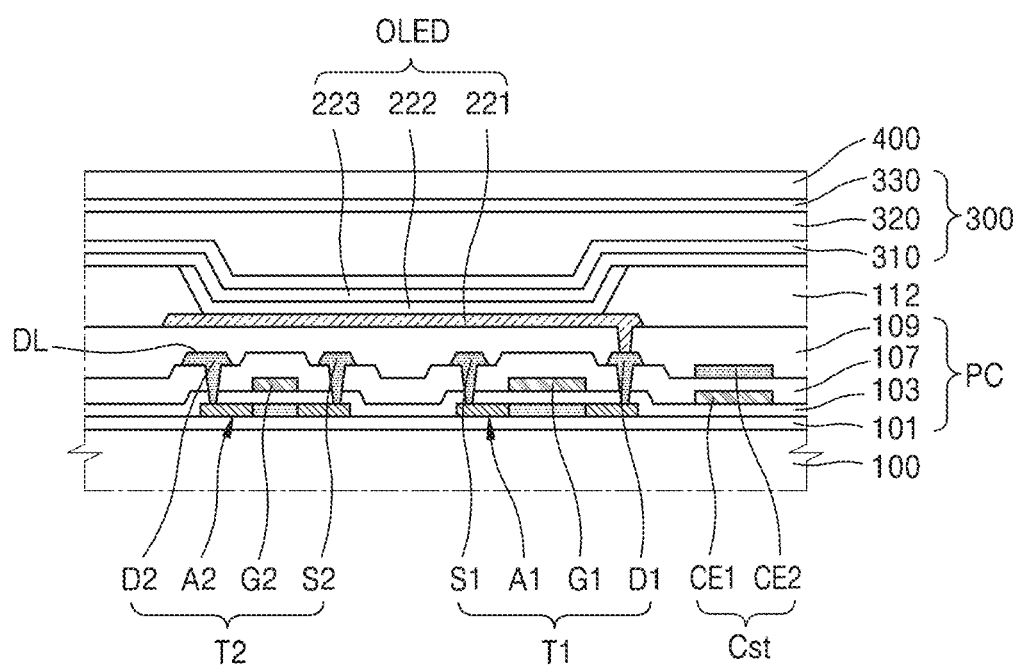
Figure 5:
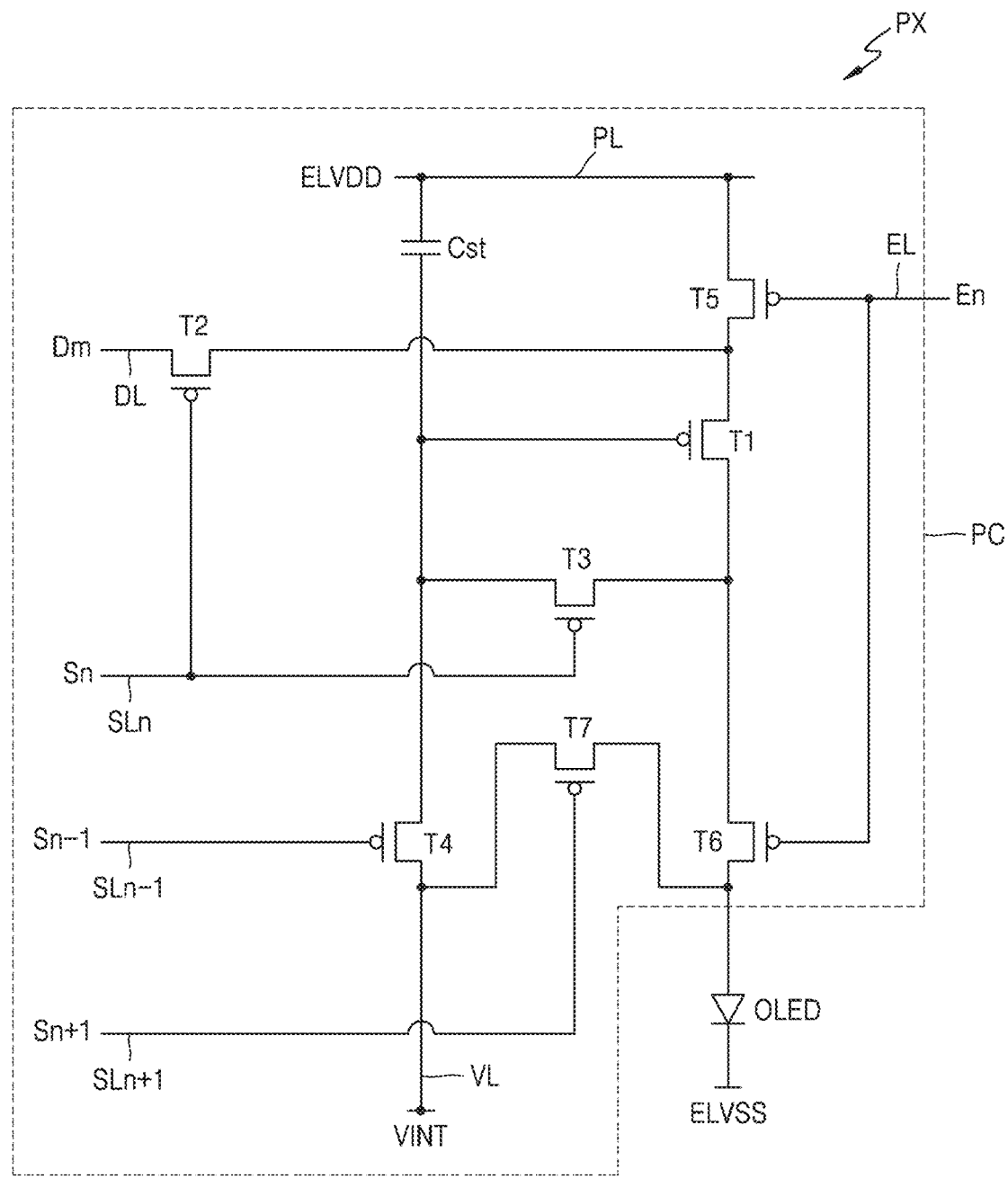
FIG. 5 is an equivalent circuit diagram of another embodiment of a pixel.

FIG. 2 is an embodiment of an equivalent circuit diagram of a pixel, FIGS. 3 and 4 are cross-sectional views of an embodiment of a pixel, and FIG. 5 is an equivalent circuit diagram of another embodiment of a pixel.

Referring to FIG. 2, each pixel PX includes a pixel circuit PC connected to the scan line SL and the data line DL, and a light-emitting diode, for example, an organic light-emitting diode OLED connected to the pixel circuit PC.

The pixel circuit PC includes a driving thin film transistor ("TFT") T1, a switching TFT T2, and a storage capacitor Cst. The switching TFT T2 is connected to the scan line SL and the data line DL and transfers a data signal Dm input through the data line DL to the driving TFT T1 in response to a scan signal Sn input through the scan line SL.

The storage capacitor Cst is connected to the switching TFT T2 and the driving voltage line PL and stores a voltage corresponding to a difference between a voltage transferred from the switching TFT T2 and the driving voltage ELVDD supplied to the driving voltage line PL.

The driving TFT T1 is connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by the driving current.

Referring to FIG. 3, a pixel PX includes the pixel circuit PC provided over the substrate 100, and the organic light-emitting diode OLED connected to the pixel circuit PC. Hereinafter, for convenience of description, description is made according to a stacking sequence.

A buffer layer 101 may be disposed on the substrate 100, may reduce or block penetration of foreign substance, moisture, or external air from the substrate 100 below, and provide a flat surface on the substrate 100. The buffer layer 101 may include an inorganic material such as an oxide or a nitride, or an organic material, or an organic/inorganic composite material. The buffer layer 101 may include a single layer or a multi-layer of an inorganic material and an organic material.

The driving TFT (also referred to as "first TFT") T1 includes a semiconductor layer A1 a gate electrode G1, a source electrode S1, and a drain electrode D1. The switching TFT (also referred to as "second TFT T2") includes a semiconductor layer A2, a gate electrode G2, a source electrode S2, and a drain electrode D2.

The semiconductor layers A1 and A2 may include amorphous silicon or polycrystalline silicon. In another embodiment, the semiconductor layers A1 and A2 may include an oxide of at least one of In, Ga, Sn, Zr, V, Hf, Cd, Ge, Cr, Ti, and Zn. Each of the semiconductor layers A1 and A2 may include a channel region, and a source region and a drain region, each doped with impurities.

The gate electrodes G1 and G2 are respectively arranged over the semiconductor layers A1 and A2 with a gate insulating layer 103 therebetween. The gate electrodes G1 and G2 may include one of Mo, Al, Cu, and Ti, and include a single layer and a multi-layer. In an embodiment, each of the gate electrodes G1 and G2 may include a single layer of Mo, for example.

The gate insulating layer 103 may include $SiO_2$, $SiN_x$, $SiON$, $Al_2O_3$, $TiO_2$, $Ta_2O_5$, $HfO_2$, or $ZnO_2$.

The source electrodes S1 and S2 and the drain electrodes D1 and D2 are arranged on an inter-insulating layer 107. The source electrodes S1 and S2 and the drain electrodes D1 and D2 may include a conductive material including Mo, Al, Cu, and Ti, and include a single layer or a multi-layer including the above materials. In an embodiment, the source electrodes S1 and S2 and the drain electrodes D1 and D2 may have a multi-structure of Ti/Al/Ti.

The inter-insulating layer 107 may include $SiO_x$, $SiN_x$, $SiON$, $Al_2O_3$, $TiO_2$, $Ta_2O_5$, $HfO_2$, or $ZnO_2$.

A first electrode CE1 of the storage capacitor Cst may overlap the first TFT T1. In an embodiment, the gate electrode G1 of the first TFT T1 may also serve as the first electrode CE1 of the storage capacitor Cst, for example.

A second electrode CE2 of the storage capacitor Cst overlaps the first electrode CE1 with a dielectric layer 105 therebetween. The second electrode CE2 may include a conductive material including Mo, Al, Cu, and Ti, and include a single layer or a multi-layer including the above materials. In an embodiment, the second electrode CE2 may include a single layer of Mo or a multi-layer of Mo/Al/Mo.

The dielectric layer 105 may include an inorganic material including an oxide or a nitride. In an embodiment, the dielectric layer 105 may include $SiO_2$, $SiN_x$, $SiON$, $Al_2O_3$, $TiO_2$, $Ta_2O_5$, $HfO_2$, or $ZnO_2$, for example.

A planarization layer 109 may be disposed on the source electrodes S1 and S2 and the drain electrodes D1 and D2. The organic light-emitting diode OLED may be disposed on the planarization layer 109. The planarization layer 109 may include a single layer or a multi-layer including a layer of an organic material. The organic material may include a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the planarization layer 109 may include a composite stacked body including an inorganic insulating layer and an organic insulating layer.

The organic light-emitting diode OLED includes a pixel electrode 221, an emission layer 222, and an opposite electrode 223.

The pixel electrode 221 may include a reflective electrode. In an embodiment, the pixel electrode 221 may include a reflective layer including one of Ag, Mg, Al, Pt, Pd, Au, Ni, Nd, Ir, Cr, and a combination thereof and a transparent or semi-transparent electrode layer disposed on the reflective layer, for example. In an embodiment, the transparent or semi-transparent electrode layer may include at least one of indium tin oxide ("ITO"), zinc oxide ("IZO"), zinc oxide (ZnO), indium oxide ($In_2O_3$), indium gallium oxide ("IGO"), and aluminum zinc oxide ("AZO"), for example.

A pixel-defining layer 112 is arranged on the pixel electrode 221. The pixel-defining layer 112 may include at least one organic insulating material including polyimide, polyamide, an acrylic resin, benzocyclobutene ("BCB"), and a phenolic resin and may be provided by spin coating, etc. The pixel-defining layer 112 exposes the pixel electrode 221, and the emission layer 222 is disposed on the exposed area.

The emission layer 222 may include an organic material including a fluorescent or phosphorescent material which emits red, green, blue, or white light. The emission layer 222 may include a low molecular weight or polymer organic material. A functional layer such as a hole transport layer ("HTL"), a hole injection layer ("HIL"), an electron transport layer ("ETL"), and an electron injection layer ("EIL") may be selectively further arranged under and on the emission layer 222.

The opposite electrode 223 may be a light-transmissive electrode. In an embodiment, the opposite electrode 223 may include a transparent or semi-transparent electrode and may include a metal thin film having a small work function and including one of Li, Ca, LiF/Ca, LiF/Al, Al, Ag, Mg, and a combination thereof, for example. Also, a transparent conductive oxide ("TCO") layer such as ITO, IZO, ZnO, or $In_2O_3$ may be further arranged on the metal thin film.

The thin-film encapsulation layer 300 prevents penetration of external moisture and oxygen. The thin-film encapsulation layer 300 may include at least one organic layer 320 and at least one inorganic layer 310 and 330. The at least one organic layer 320 and the at least one inorganic layer 310 and 330 may be stacked in turns. Though it is shown in FIG. 3 that the thin-film encapsulation layer 300 includes two inorganic layers 310 and 330 and one organic layer 320, a stacking sequence and the number of times layers are stacked are not limited to the embodiment shown in FIG. 3.

A touch film 400 may be arranged on the thin-film encapsulation layer 300 to implement a touchscreen function of the display device 1. The touch film 400 may include a touch electrode of various patterns and include a resistance layer-type touch film or a capacitance-type touch film.

Referring to FIG. 4, the storage capacitor Cst of the pixel circuit PC may be arranged not to overlap the driving TFT T1. The description of the pixel PX that is the same as that of FIG. 3 is omitted, and a difference is mainly described below.

The first electrode CE1 of the storage capacitor Cst may be arranged in the same layer as a layer in which the gate electrodes G1 and G2 are arranged and may include the same material as those of the gate electrodes G1 and G2. The second electrode CE2 may be arranged in the same layer as a layer in which the source electrodes S1 and S2 and the drain electrodes D1 and D2 are arranged and may include the same material as those of the source electrodes S1 and S2 and the drain electrodes D1 and D2. The inter-insulating layer 107 may serve as a dielectric.

Though it is shown in FIGS. 3 and 4 that the first TFT T1 and the second TFT T2 are top gate-type TFTs in which the gate electrodes G1 and G2 are arranged over the semiconductor layers A1 and A2 with the gate insulating layer 103 therebetween, the invention is not limited thereto. In another embodiment, the first TFT T1 and the second TFT T2 may be bottom gate-type TFTs.

Though FIGS. 3 and 4 describe a structure in which the first TFT T1 and the pixel electrode 221 are connected to each other through a via hole of the planarization layer 109, the invention is not limited thereto.

Though FIG. 2 describes the case where the pixel PX includes two TFTs and one storage capacitor, the invention is not limited thereto.

Referring to FIG. 5, the pixel circuit PC may not only include the driving and switching TFTs T1 and T2, but also further include a compensation TFT T3, a first initialization TFT T4, a first emission control TFT T5, a second emission control TFT T6, and a second initialization TFT T7.

A drain electrode of the driving TFT T1 may be electrically connected to the organic light-emitting diode OLED through the second emission control TFT T6. The driving TFT T1 may receive a data signal Dm and supplies a driving current to the organic light-emitting diode OLED in response to a switching operation of the switching TFT T2.

A gate electrode of the switching TFT T2 is connected to a first scan line SLn, and a source electrode of the switching TFT T2 is connected to the data line DL. A drain electrode of the switching TFT T2 may be connected to the source electrode of the driving TFT T1 and simultaneously connected to a driving voltage line PL through the first emission control TFT T5.

The switching TFT T2 performs a switching operation of being turned on in response to a first scan signal Sn transferred through the first scan line SLn and transferring the data signal Dm transferred through the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and simultaneously connected to the pixel electrode of the organic light-emitting diode OLED through the second emission control TFT T6. A drain electrode of the compensation TFT T3 may be connected to one of the electrodes of the storage capacitor Cst, a source electrode of the first initialization TFT T4, and the gate electrode of the driving TFT T1 simultaneously. The compensation TFT T3 is turned on in response to a first scan signal Sn transferred through the first scan line SLn and diode-connects the driving TFT T1 by connecting the gate electrode and the drain electrode of the driving TFT T1 to each other.

A gate electrode of the first initialization TFT T4 may be connected to a second scan line SLn−1. A drain electrode of the first initialization TFT T4 may be connected to an initialization voltage line VL. A source electrode of the first initialization TFT T4 may be connected to one of the electrodes of the storage capacitor Cst, the drain electrode of the compensation TFT T3, and the gate electrode of the driving TFT T1 simultaneously. The first initialization TFT T4 may perform an initialization operation of being turned on in response to a second scan signal Sn−1 transferred through the second scan line SLn−1 and initializing a voltage of the gate electrode of the driving TFT T1 by transferring an initialization voltage VINT to the gate electrode of the driving TFT T1.

A gate electrode of the first emission control TFT T5 may be connected to an emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2 simultaneously.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting diode OLED. When the first emission control TFT T5 and the second emission control TFT T6 are simultaneously turned on in response to an emission control signal En transferred through the emission control line EL, the driving voltage ELVDD is transferred to the organic light-emitting diode OLED, and a driving current flows through the organic light-emitting diode OLED.

A gate electrode of the second initialization TFT T7 may be connected to a third scan line SLn+1. A source electrode of the second initialization TFT T7 may be connected to the pixel electrode of the organic light-emitting diode OLED. A drain electrode of the second initialization TFT T7 may be connected to the initialization voltage line VL. The second initialization TFT T7 may be turned on in response to a third scan signal Sn+1 transferred through the third scan line SLn+1 and may initialize the pixel electrode of the organic light-emitting diode OLED.

The other electrode of the storage capacitor Cst may be connected to the driving voltage line PL. One electrode of the storage capacitor Cst may be connected to the gate electrode of the driving TFT T1, the drain electrode of the compensation TFT T3, and the source electrode of the first initialization TFT T4 simultaneously.

The opposite electrode of the organic light-emitting diode OLED is connected to the common voltage (also referred to as "common power voltage") ELVSS. The organic light-emitting diode OLED emits light by receiving the driving current from the driving TFT T1.

Figure 6:
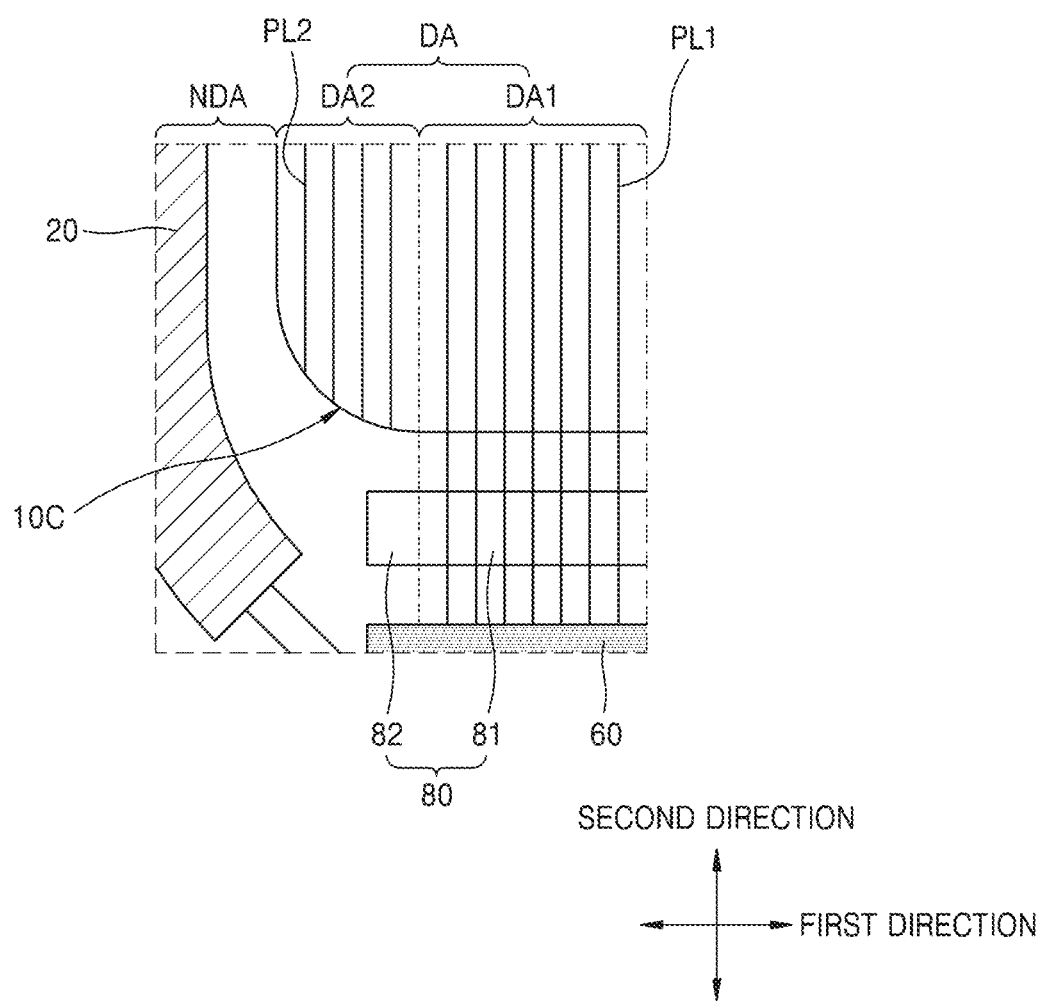
FIGS. 6 and 7 are enlarged views of a portion A of FIG. 1.
Figure 7:
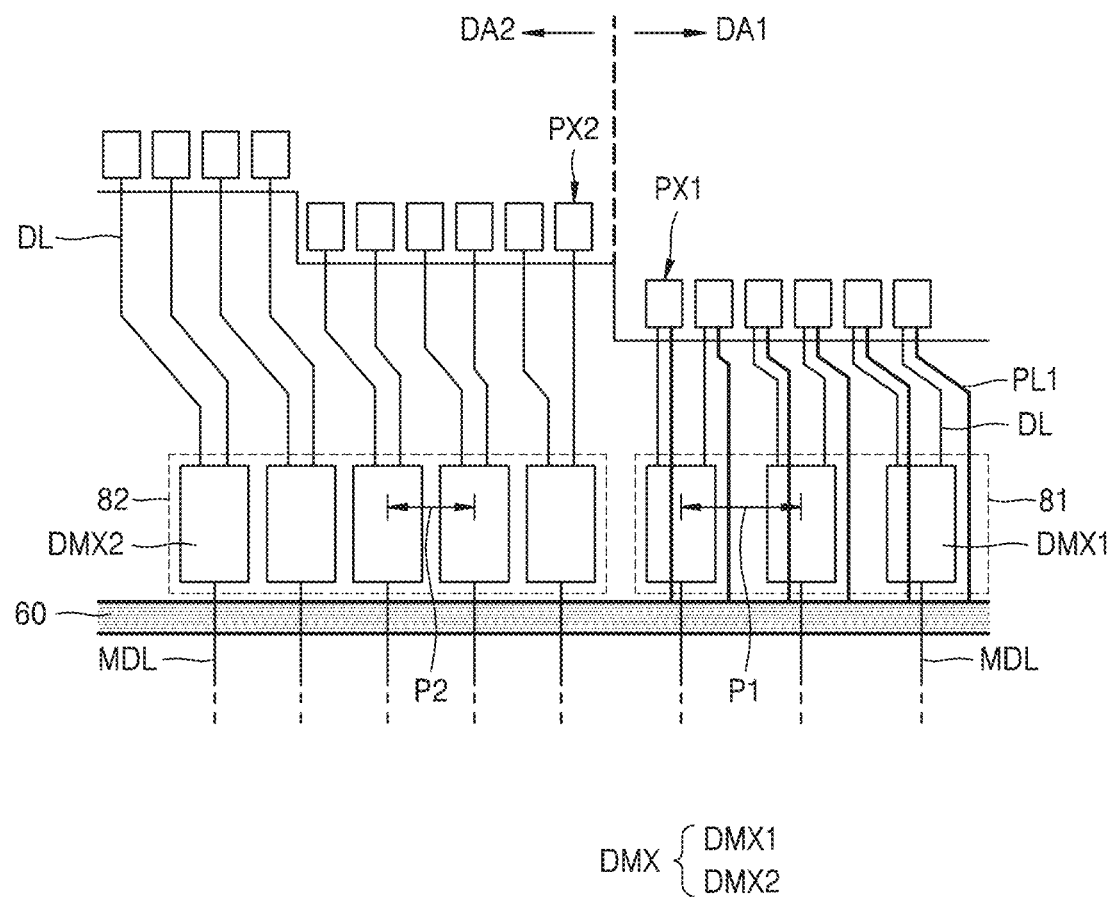

FIG. 6 is a plan view of a portion A of FIG. 1, and FIG. 7 is an enlarged view of a portion of FIG. 6. FIGS. 6 and 7 enlarge and show the corner portion 10C of the display unit 10 of FIG. 1 and surroundings thereof.

Referring to FIGS. 1, 6, and 7, the display device 1 in an embodiment includes the display unit 10 in which edges thereof are rounded. The display unit 10 includes the first display area DA1 and the second display area DA2, each including an array of plurality of pixels PX and extending in the second direction. The second display area DA2 includes a rounded corner portion 10C, and the first display area DA1 is arranged between the second display areas DA2.

Since the pixels PX arranged in the rounded corner portion 10C are substantially arranged stepwise, a boundary between the first display area DA1 and the second display area DA2 may be a portion from which a first stepwise arrangement of the pixels PX starts. Therefore, the first display area DA1 includes a straight pixel arrangement over an entire area, and the second display area DA2 includes a stepwise pixel arrangement at the corner portion 10C.

The driving voltage supply line 60 and the switching unit 80 may be disposed in the non-display area NDA on one side of the display unit 10. Though it is shown in the embodiment that the switching unit 80 is arranged between the driving voltage supply line 60 and the display unit 10, a first driving voltage supply line 61 and a second driving voltage supply line 62 may be disposed with the switching unit 80 therebetween as shown in FIG. 9 in another embodiment, which will be described in detail with reference to FIGS. 8 and 9.

The switching unit 80 includes a plurality of demultiplexers DMX which demuxes a data signal and supplies the demuxed data signal to a plurality of data lines DL. Though not shown, each of the plurality of demultiplexers DMX may include a control TFT and a switching TFT. Though it is shown in FIG. 7 that the demultiplexer DMX is connected to two data lines DL, the demultiplexer DMX may be connected to three or more data lines DL.

The demultiplexer DMX is connected to the data driver 40 through a multiplex data line MDL. The data driver 40 generates multiplex data signals under control of a controller (not shown) and supplies the generated multiplex data signals to the multiplex data line MDL. That is, the data driver 40 may supply signals to two or more data lines DL through one multiplex data line MDL by the demultiplexer DMX. Through this, the number of output lines connected to the data driver 40 may be effectively reduced under high resolution.

The switching unit 80 includes a first switching unit 81 and a second switching unit 82 separated around a boundary between the first display area DA1 and the second display area DA2. The first switching unit 81 may correspond to the first display area DA1, and the second switching unit 82 may correspond to the second display area DA2.

The first switching unit 81 and the second switching unit 82 may respectively include a plurality of first demultiplexers DMX1 and a plurality of second demultiplexers DMX2. In the illustrated embodiment, the plurality of first demultiplexers DMX1 is arranged at a first pitch P1, and the plurality of second demultiplexers DMX2 is arranged at a second pitch P2. In this case, the second pitch P2 may be less than the first pitch P1.

A plurality of first driving voltage lines PL1 which is arranged in the first direction and extended in the second direction, and supplies the driving voltage to a plurality of first pixels PX1 is provided in the first display area DA1. A plurality of second driving voltage lines PL2 which is arranged in the first direction and extended in the second direction, and supplies the driving voltage to a plurality of second pixels PX2 is provided in the second display area DA2. The plurality of first driving voltage lines PL1 is connected to the driving voltage supply line 60 passing the first switching unit 81. In contrast, the plurality of second driving voltage lines PL2 is not connected to the driving voltage supply line 60. That is, the plurality of first driving voltage lines PL1 extends to an area between the first display area DA1 and the driving voltage supply line 60 and is connected to the driving voltage supply line 60. In contrast, the plurality of second driving voltage lines PL2 does not extend to an area between the second display area DA2 and the driving voltage supply line 60 and thus is disconnected from the driving voltage supply line 60.

All of the plurality of pixels PX arranged in the display unit 10 are connected to the data line DL and the driving voltage line PL arranged in the first direction and extended in the second direction. The data line DL and the driving voltage line PL extend from the display area DA to the non-display area NDA and are electrically connected to the controller (not shown). In this case, compared to the first display area DA1 in which an outer edge of the display unit 10 is provided in a straight line, the second display area DA2 in which an outer edge of the display unit 10 is provided in a rounded shape includes a limited space of the non-display area NDA in which the data line DL and the driving voltage line PL are connected to all of the pixels PX in the second display area DA2. This space is further limited when high resolution is implemented and a curvature of the corner portion 10C becomes small.

Therefore, in the display device 1 in an embodiment, the plurality of second driving voltage lines PL2 arranged in the second display area DA2 does not extend to the area between the second display area DA2 and the driving voltage supply line 60, and is disconnected from the driving voltage supply line 60. Through this configuration, a space in which the data lines DL are arranged in the area between the second display area DA2 and the driving voltage supply line 60 may be effectively secured.

Figure 8:
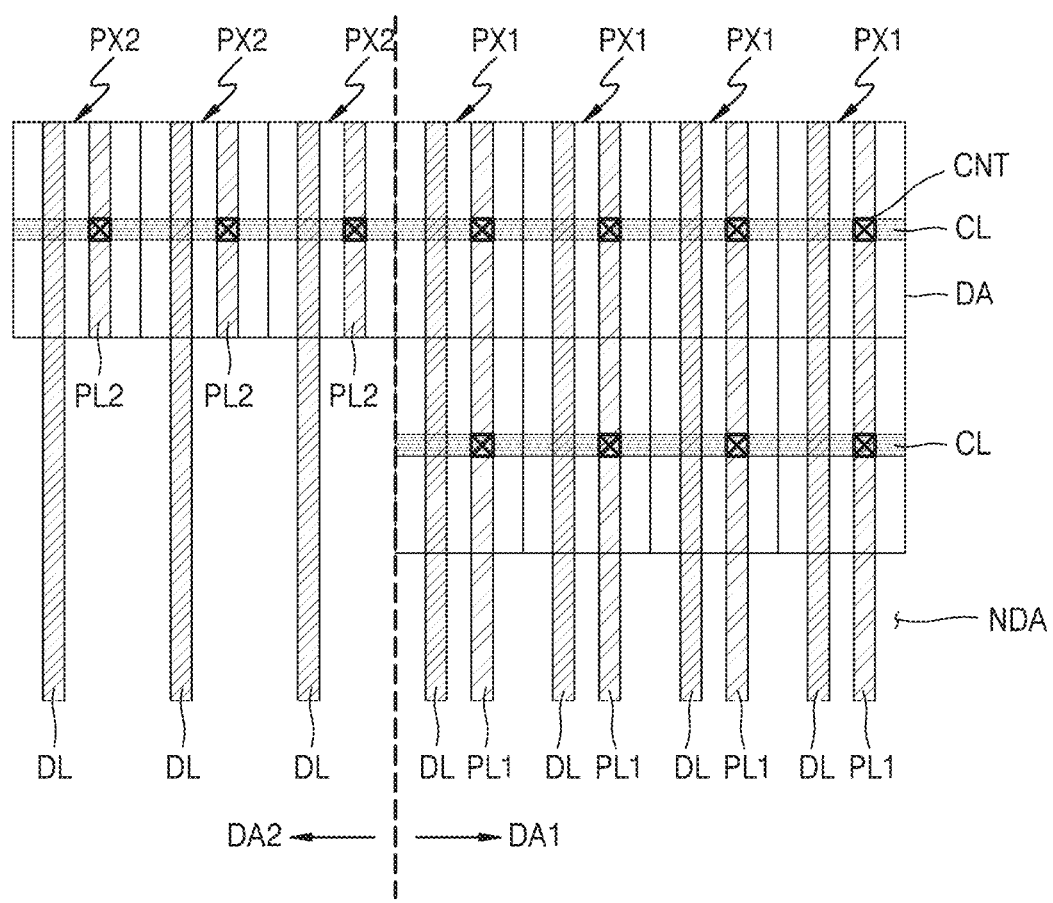
FIG. 8 is a plan view of an embodiment of a pixel structure.
Figure 9:
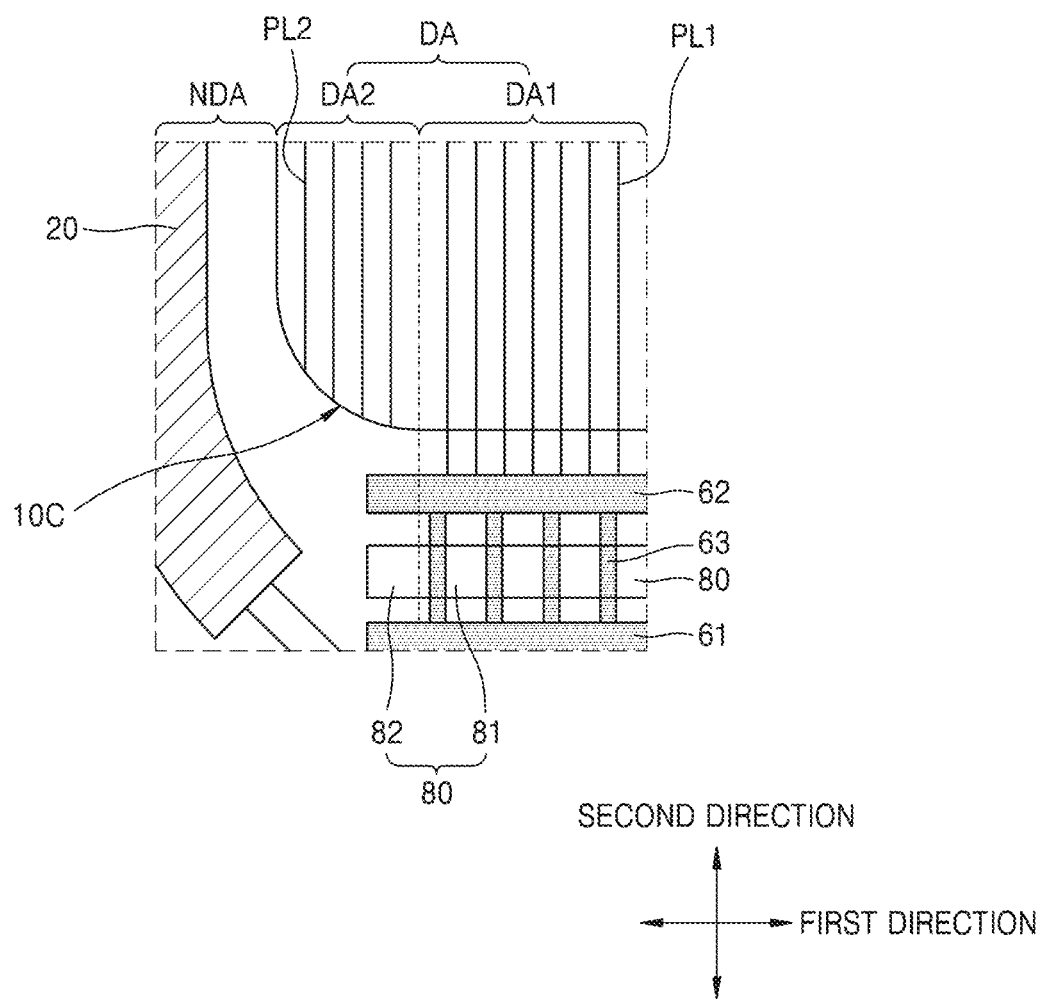
FIGS. 9 and 10 are enlarged views of modified embodiments of FIGS. 6 and 7, respectively.

FIG. 8 is a plan view of an embodiment of a pixel structure.

Referring to FIGS. 8 and 6, all of the data line DL and the plurality of first driving voltage lines PL1 connected to the first pixels PX1 in the first display area DA1 extend to the non-display area NDA. In contrast, the data line DL connected to the second pixels PX2 in the second display area DA2 extends to the non-display area NDA but the plurality of second driving voltage lines PL2 does not extend to the non-display area NDA and is disconnected from an outer edge of the second display area DA2.

As described above, since the plurality of second driving voltage lines PL2 does not extend to the non-display area NDA, the plurality of second driving voltage lines PL2 is not directly connected to the driving voltage supply line 60 arranged in the non-display area NDA. Therefore, the plurality of second driving voltage lines PL2 may be electrically connected to each other by a plurality of connection lines CL extended in the first direction so as to receive the driving voltage. The plurality of connection lines CL may intersect with the plurality of first driving voltage lines PL1 and the plurality of second driving voltage lines PL2 to constitute a mesh shape. The plurality of second driving voltage lines PL2 may supply the driving voltage to the pixels PX2 disposed in the second display area DA2 through the plurality of connection lines CL. The first pixels PX1 and the second pixels PX2 disposed on the same row may be connected through the same connection line CL.

The plurality of connection lines CL may be electrically connected through a contact hole CNT defined in an insulating layer (not shown) arranged between the plurality of second driving voltage lines PL2 and the plurality of connection lines CL. In an embodiment, the plurality of connection lines CL may be arranged in the same layer in which the second electrode CE2 of the storage capacitor Cst of FIG. 3 is arranged, and the plurality of second driving voltage lines PL2 may be arranged in the same layer in which the data line DL of FIG. 3 is arranged. Through this structure, consequently, the driving voltage supplied to the driving voltage line PL disposed in the display area DA may include a mesh path.

Figure 10:
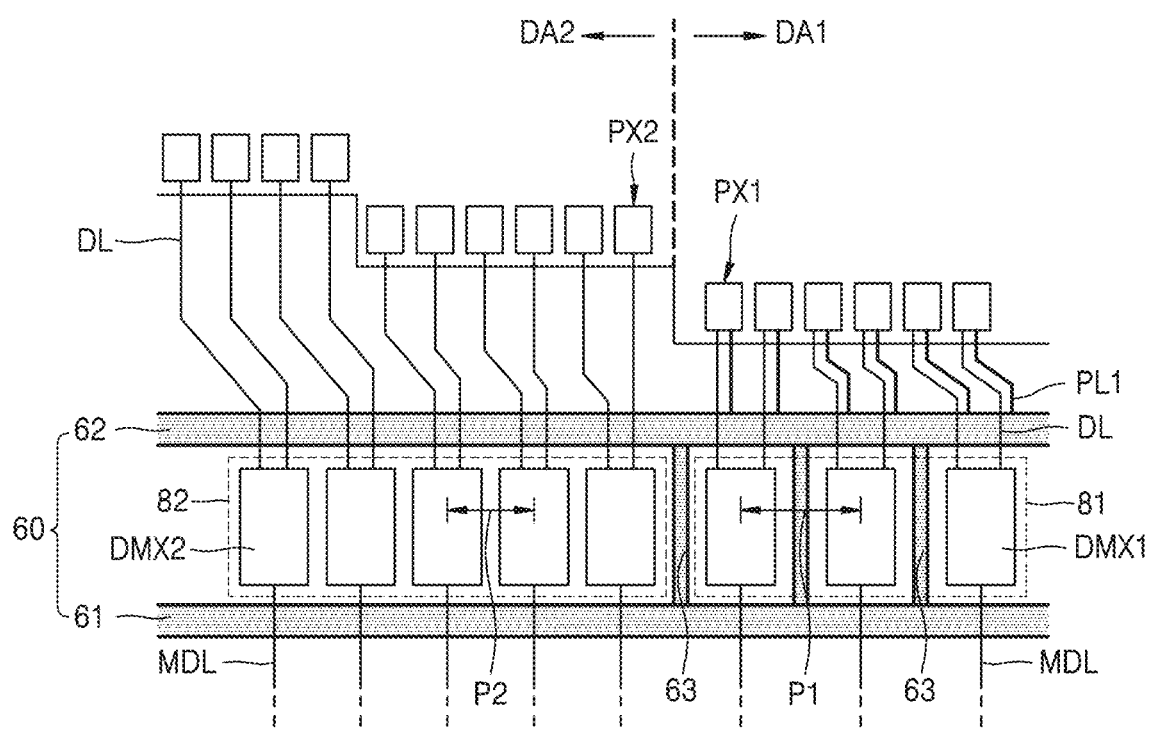

FIGS. 9 and 10 are plan views of another embodiment of the display device 1. FIGS. 9 and 10 show modified embodiments of FIGS. 6 and 7.

Referring to FIGS. 9 and 10, the display device 1 according to the embodiment includes the first driving voltage supply line 61, the second driving voltage supply line 62, and a plurality of connection lines 63 connecting the first driving voltage supply line 61 and the second driving voltage supply line 62. The first driving voltage supply line 61 and the second driving voltage supply line 62 may be arranged in the second direction, and the plurality of connection lines 63 may be arranged in the first direction that intersects with the second direction.

The first driving voltage supply line 61 may be directly connected to the first driving voltage line PL1 extending from the first display area DA1, and the second driving voltage supply line 62 may be directly connected to the terminal 52 (refer to FIG. 1). Through this double wiring structure, a resistance of the wiring itself may be reduced and thus the driving voltage may be effectively supplied to the display area DA under high resolution.

The switching unit 80 is arranged between the first driving voltage supply line 61 and the second driving voltage supply line 62. Like the previous embodiment, the switching unit 80 includes the first switching unit 81 and the second switching unit 82 separated around the boundary between the first display area DA1 and the second display area DA2. The first switching unit 81 corresponds to the first display area DA1, and the second switching unit 82 corresponds to the second display area DA2.

The first switching unit 81 and the second switching unit 82 may respectively include the plurality of first demultiplexers DMX1 and the plurality of second demultiplexers DMX2. In the illustrated embodiment, the plurality of first demultiplexers DMX1 is arranged at the first pitch P1, and the plurality of second demultiplexers DMX2 is arranged at the second pitch P2. In this case, the second pitch P2 may be less than the first pitch P1. Referring to FIG. 10, the connection line 63 may be disposed between the plurality of first demultiplexers DMX1.

Figure 11:
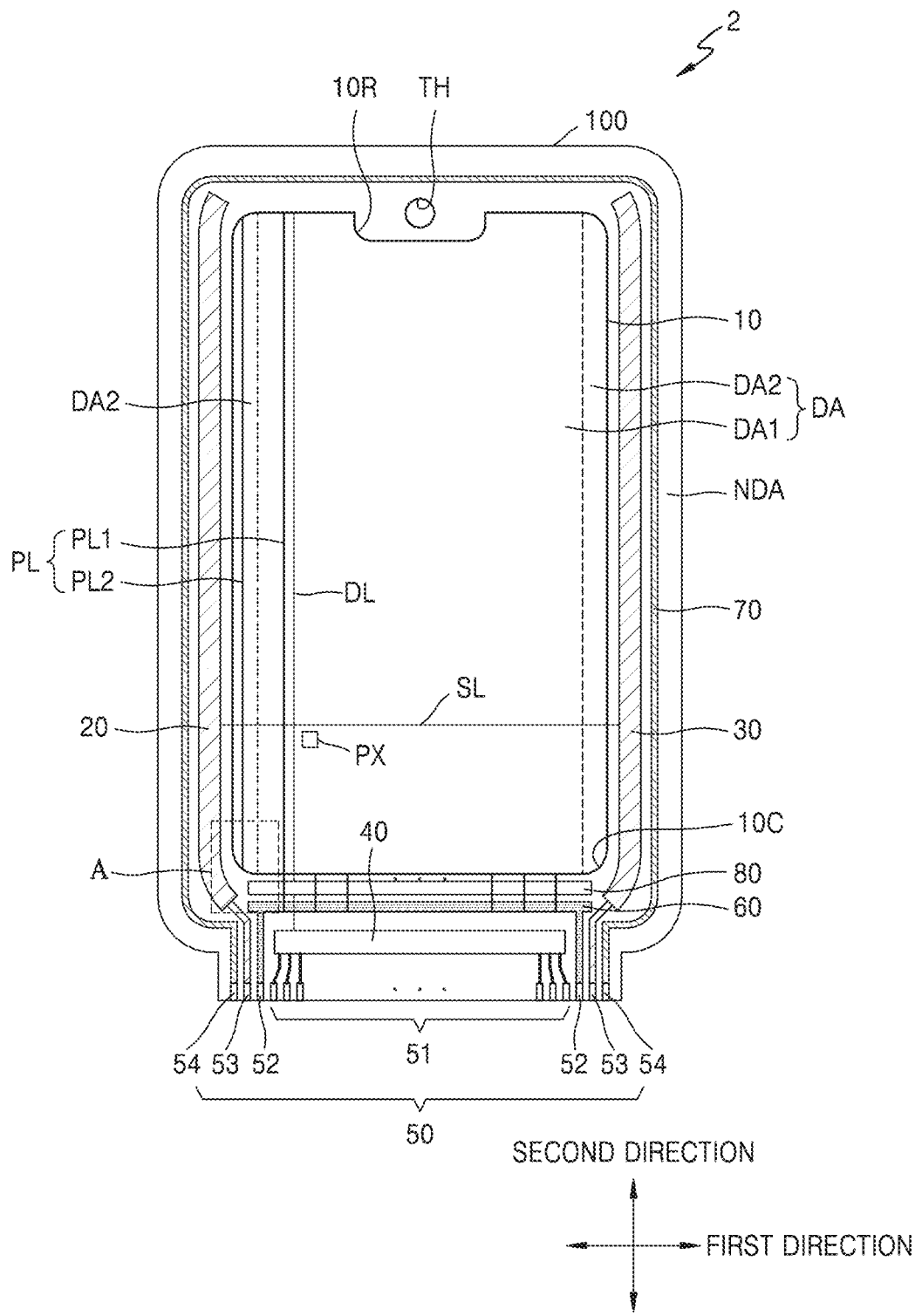
FIGS. 11 and 12 are plan views of a modified embodiment of FIG. 1.

FIG. 11 is a plan view of a display device 2 according to another embodiment. The display device 2 of FIG. 11 is different from the display device 1 of FIG. 1 in the shape of the display unit 10. Therefore, repeated description is omitted and a difference is mainly described below.

Referring to FIG. 11, the display device 2 according to the illustrated embodiment may include the display unit 10 having various shapes. The display unit 10 may include a concave portion 10R indented inward in one side of the display unit 10. A through portion TH may be disposed in the non-display area NDA in which the concave portion 10R is disposed. In an embodiment, the through portion TH is a hole that passes through the display device 2, for example. Various electronic elements such as a camera, a sensor, a speaker, a microphone, etc., may be disposed (e.g., mounted) on the through portion TH. In an alternative embodiment, the through portion TH may include a space for a separate member for a function of the display device 2 or a separate member that may add a new function to the display device 2.

Figure 12:
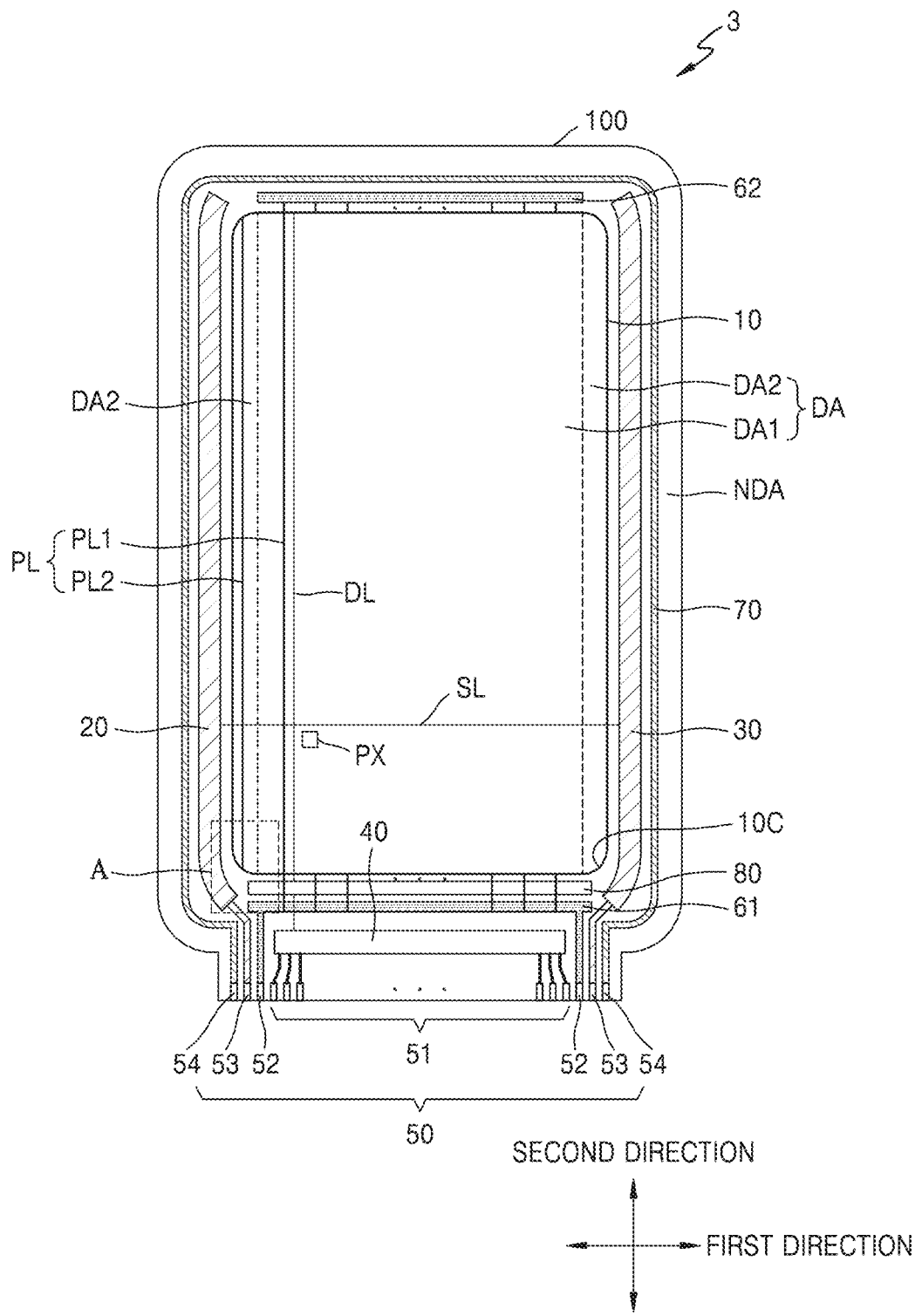

FIG. 12 is a plan view of another embodiment of a display device 3. The display device 3 of FIG. 12 is different from the display device 1 of FIG. 1 in the configuration of the driving voltage supply line. Therefore, repeated description is omitted and a difference is mainly described below.

Referring to FIG. 12, the display device 3 in the illustrated embodiment may include the first driving voltage supply line 61 on one side of the display unit 10, and the second driving voltage supply line 62 on another side of the display unit 10. One side of the first driving voltage line PL1 disposed in the first display area DA1 may be connected, in the second direction, to the first driving voltage supply line 61, and another side of the first driving voltage line PL1 may be connected, in the second direction, to the second driving voltage supply line 62.

The second driving voltage line PL2 disposed in the second display area DA2 does not extend toward the first driving voltage supply line 61 and the second driving voltage supply line 62 and is not connected to the first driving voltage supply line 61 and the second driving voltage supply line 62 in the second direction. The second driving voltage line PL2 is not directly connected to the first driving voltage supply line 61 and the second driving voltage supply line 62 in the second direction. The second driving voltage line PL2 is removed in the non-display area NDA between the second display area DA2 and the first driving voltage supply line 61 and in the non-display area NDA between the second display area DA2 and the second driving voltage supply line 62, and thus is disconnected from the first driving voltage supply line 61 and the second driving voltage supply line 62 in the non-display area NDA. As described above, the second driving voltage line PL2 may receive the driving voltage by being electrically connected to the plurality of connection lines CL (refer to FIG. 8) and having a mesh shape.

Figure 13:
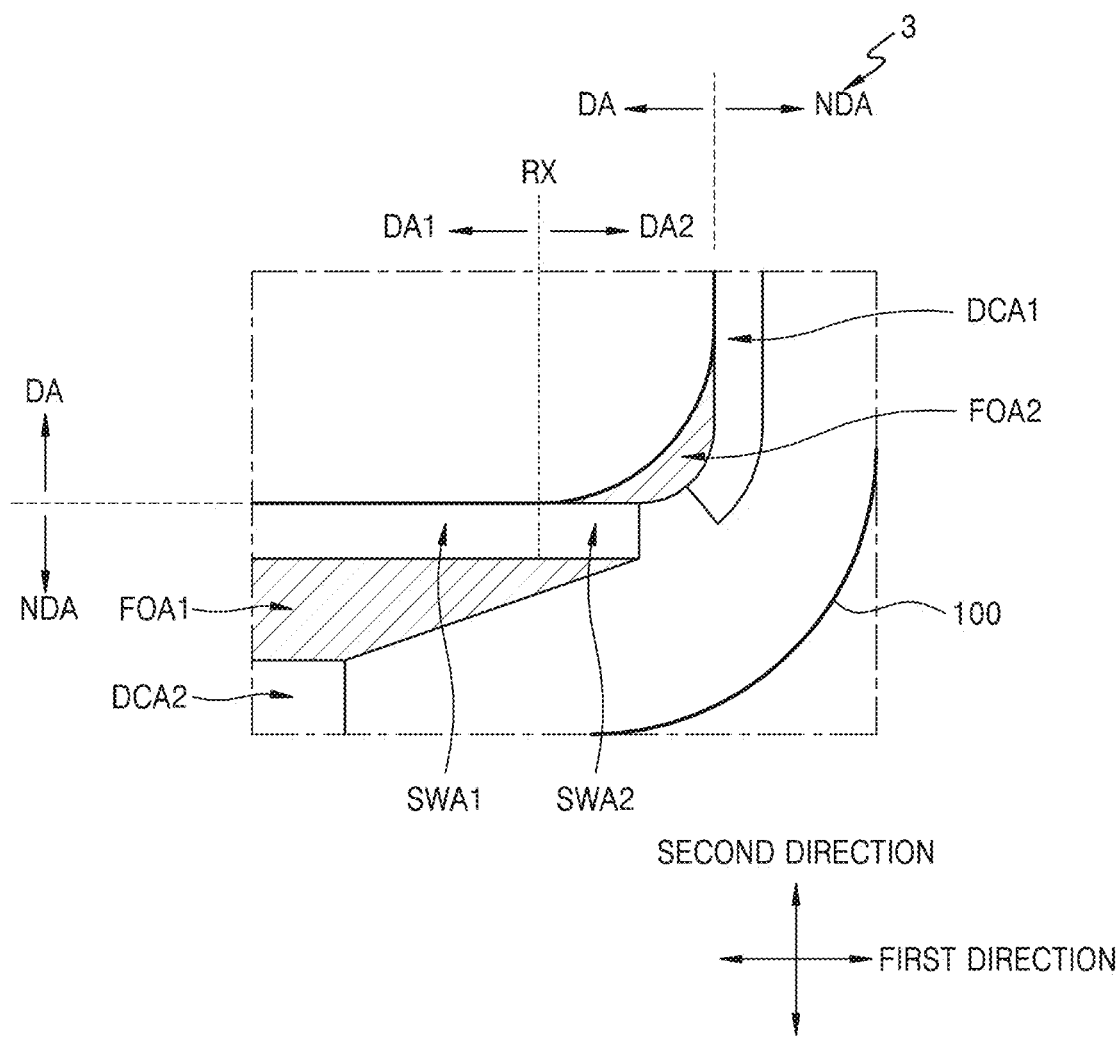
FIG. 13 is an enlarged plan view of an embodiment of a display device.

FIG. 13 is an enlarged plan view of a portion of the display device 1 in an embodiment. FIG. 13 may correspond to a lower right end of the display device 1 of FIG. 1. FIG. 13 may be understood as an area that is symmetrical with a portion A of FIG. 1.

Referring to FIG. 13, one side with reference to a reference line RX may be defined as the first display area DA1, and another side with reference to the reference line RX may be defined as the second display area DA2. The second display area DA2 includes an area including the rounded corner portion 10C, and the reference line RX may be understood as a point from which the rounded corner portion 10C starts. An edge of the substrate 100 that is adjacent to the second display area DA2 may be provided in a rounded shape corresponding to the shape of the rounded corner portion 10C.

A first driving circuit area DCA1 may be disposed in the non-display area NDA that is adjacent to the second display area DA2 in the first direction. Driving circuits such as an emission control driver (not shown) as well as the second scan driver 30 of FIG. 1 may be arranged in the first driving circuit area DCA1.

First and second switching areas SWA1 and SWA2 may be arranged in the non-display area NDA that is adjacent to the first and second display areas DA1 and DA2 in the first direction. The first and second switching units 81 and 82 of FIG. 6 may be arranged in the first and second switching areas SWA1 and SWA2, and may include the first and second demultiplexers DMX1 and DMX2 as shown in FIG. 7.

A second driving circuit area DCA2 may be disposed in an edge of the substrate 100. The data driver 40 of FIG. 1 may be disposed in the second driving circuit area DCA2. Though not shown, a film on glass ("FOG"), a chip on glass ("COG"), etc., may be arranged in the relevant area.

A first fan-out area FOA1 may be disposed between the first and second switching areas SWA1 and SWA2 and a second driving circuit area DCA2. Also, a second fan-out area FOA2 may be disposed between the second display area DA2 and the second switching area SWA2. The multiplex data line MDL (refer to FIG. 7) may be arranged in the first fan-out area FOAL The data line DL (refer to FIG. 7) may be arranged in the second fan-out area FOA2.

Referring to FIGS. 13 and 7 (or FIG. 9), compared to the first display area DA1 in which an outer edge of the display unit 10 is provided in a straight line, the second display area DA2 in which an outer edge of the display unit 10 is provided in a rounded shape includes a limited space of the non-display area NDA, that is, the second fan-out area FOA2, in which the data line DL and the driving voltage line PL are connected to all of the pixels PX in the second display area DA2. This space is further limited when high resolution is implemented and a curvature of the corner portion 10C becomes small.

The plurality of driving voltage lines PL2 arranged in the second display area DA2 is disconnected from the driving voltage supply line 60 and receives an electric signal through a mesh shape as shown in FIG. 8. Through this structure, a space in which the data line DL is arranged in the second fan-out area FOA2 between the second display area DA2 and the second switching area SWA2 may be efficiently secured.

An embodiment may implement a display device which implements various shapes of a display area that displays an image, and simultaneously, includes a reduced dead space. However, the scope of the invention is not limited by this effect.

Although the invention has been described with reference to the embodiments illustrated in the drawings, this is merely provided as an example and it will be understood by those of ordinary skill in the art that various changes in form and details and equivalents thereof may be made therein without departing from the spirit and scope of the invention as defined by the following claims.

What is claimed is:

1. A display device defining a first direction and a second direction intersecting with the first direction, the display device comprising:
 a display unit disposed over a substrate and including a first display area and a second display areas, each of the first display area and second display areas including a plurality of pixel arrays, wherein the second display areas are arranged in the first direction with the first display area therebetween, wherein a length of a part of the second display areas extending in the second direction is less than a length of the first display area extending in the second direction;
 a first electrode extending in the first direction in a non-display area on one side of the display unit;
 a plurality of first wires which connects to a plurality of pixels, the plurality of first wires being arranged in the first display area in the first direction and extending in the second direction, extending to an area between the first display area and the first electrode, and at least one of the both ends in the second direction of the first wires being contact with the first electrode;
 a plurality of second wires which connects to the plurality of pixels, the plurality of second wires being arranged in the second display area in the first direction, and being apart from the first electrode in an area between the second display area and the first electrode;
 a switching unit including a plurality of demultiplexers which is arranged in the non-display area, demuxes a data signal and supplies the demuxed data signal to a plurality of data lines; and
 a second line arranged in parallel to the first electrode with the switching unit therebetween and connected to a terminal unit at an edge of the substrate,
 wherein the display unit includes a plurality of scan lines and the plurality of data lines respectively connected to the plurality of pixels.

2. The display device of claim 1,
 wherein the at least one connection line comprises a plurality of connection lines extending in the first direction, and
 wherein the plurality of first wires and the plurality of second wires are electrically connected to the plurality of connection lines.

3. The display device of claim 2, wherein the plurality of connection lines intersects with the plurality of first wires and the plurality of second wires to constitute a mesh shape.

4. The display device of claim 2,
 wherein the plurality of first wires supplies the driving voltage to the plurality of pixels disposed in the first display area through the plurality of connection lines, and
 wherein the plurality of second wires supplies the driving voltage to the plurality of pixels disposed in the second display area through the plurality of connection lines.

5. The display device of claim 1, wherein the switching unit includes:
 a first switching unit which demuxes a data signal supplied to the first display area; and
 a second switching unit which demuxes a data signal supplied to the second display area,
 wherein a plurality of first demultiplexers included in the first switching unit is arranged at a first pitch, and a plurality of second demultiplexers included in the second switching unit is arranged at a second pitch less than the first pitch.

6. The display device of claim 5, wherein the first electrode and the second line are electrically connected to each other through a plurality of connection lines arranged between the plurality of first demultiplexers.

7. The display device of claim 1, wherein pixels of the plurality of pixels which are adjacent to an outer edge of the display unit are arranged stepwise.

8. The display device of claim 1, wherein the display unit has one of a polygonal shape, a circular shape, and an elliptical shape.

9. The display device of claim 1, further comprising a substrate over which the display unit is disposed, the substrate including curved edges.

10. The display device of claim 1, wherein a length of the plurality of second wires extending in the second direction is less than a length of the plurality of first wires.

11. A display device comprising:
a display unit in which a first display area and a second display area including a corner portion at an edge of the first display area are defined, the display unit including a plurality of first pixels and a plurality of second pixels, the plurality of first pixels and the plurality of second pixels being respectively disposed in the first display area and the second display area, and being connected to a plurality of first extending lines and a plurality of wires extending in a second direction and a plurality of second extending lines extending in a first direction which intersects with the second direction;
a second driver and a first driver arranged in a non-display area, the non-display area being outside of the display unit;
a switching unit including a plurality of demultiplexers which is arranged in the non-display area, demuxes a first signal output from the first driver and supplies the demuxed first signal to the plurality of first extending lines; and
a conductive line arranged in the non-display area and connected to the plurality of lines extending from the display unit,
wherein the plurality of wires include a first wire connected to the plurality of first pixels and a plurality of second wires connected to the plurality of second pixels, the first wire extends to the non-display area and at least one of the both ends in the second direction of the first wire is connected to the conductive line, and the plurality of second wires are apart from the conductive line in the non-display area, and
wherein at least one connection line extends in the first direction at least partially within the second display area and connects the plurality of second wires to each other,
wherein the conductive line includes a first electrode and a second electrode extending in the first direction with the switching unit therebetween, the plurality of wires is connected to the first electrode, and the second electrode is connected to a terminal unit.

12. The display device of claim 11, wherein the corner portion has a rounded shape.

13. The display device of claim 11, wherein pixels of the plurality of pixels which are adjacent to an outer edge of the display unit are arranged stepwise.

14. The display device of claim 11, wherein a driving voltage supplied to the plurality of wires is supplied along a mesh path.

15. The display device of claim 11,
wherein the at least one connection line comprises a plurality of connection lines extending in the first direction, and
wherein the plurality of connection lines are connected to the first wire and the plurality of second wires by contacting the first wire and the plurality of second wires.

16. The display device of claim 15, wherein an insulating layer is arranged between the plurality of connection lines and the first wire and the plurality of second wires, and the plurality of connection lines is electrically connected to the first wire and the plurality of second wires through a contact hole in the insulating layer.

17. The display device of claim 11, wherein the conductive line further includes a plurality of connection lines connecting the first electrode and the second electrode, the plurality of connection lines being disposed between the plurality of demultiplexers.

18. A display device comprising:
a display unit in which a first display area and a second display area including a corner portion at an edge of the first display area are defined, the display unit including a plurality of first pixels and a plurality of second pixels, the plurality of first pixels and the plurality of second pixels being respectively disposed in the first display area and the second display area, and being connected to a plurality of first extending lines and a plurality of wires extending in a second direction and a plurality of second extending lines extending in a first direction which intersects with the second direction;
a second driver and a first driver arranged in a non-display area, the non-display area being outside of the display unit;
a switching unit including a plurality of demultiplexers which is arranged in the non-display area, demuxes a first signal output from the first driver and supplies the demuxed first signal to the plurality of first extending lines; and
a conductive line arranged in the non-display area and connected to the plurality of lines extending from the display unit,
wherein the plurality of wires include a first wire connected to the plurality of first pixels and a plurality of second wires connected to the plurality of second pixels, the first wire extends to the non-display area and at least one of the both ends in the second direction of the first wire is connected to the conductive line, and the plurality of second wires are apart from the conductive line in the non-display area,
wherein at least one connection line extends in the first direction at least partially within the second display area and connects the plurality of second wires to each other
wherein the switching unit further includes:
a first switching unit which demuxes the first signal supplied to the plurality of first pixels; and
a second switching unit which demuxes the first signal supplied to the plurality of second pixels, and
wherein a plurality of demultiplexers included in the first switching unit is arranged at a first pitch, and a plurality of demultiplexers included in the second switching unit is arranged at a second pitch less than the first pitch.

19. The display device of claim 18, wherein the conductive line includes a first electrode and a second electrode extending in the first direction with the switching unit therebetween, the plurality of wires is connected to the first electrode, and the second electrode is connected to a terminal unit.

* * * * *